United States Patent
Sakamoto et al.

(10) Patent No.: US 6,864,121 B2
(45) Date of Patent: Mar. 8, 2005

(54) METHOD OF MANUFACTURING CIRCUIT DEVICE

(75) Inventors: Noriaki Sakamoto, Gunma (JP); Yoshiyuki Kobayashi, Gunma (JP); Junji Sakamoto, Gunma (JP); Yukio Okada, Gunma (JP); Yusuke Igarashi, Gunma (JP); Eiju Maehara, Gunma (JP); Kouji Takahashi, Gunma (JP)

(73) Assignee: Sanyo Electric Co., Ltd., Osaka (JP)

( * ) Notice: Subject to any disclaimer, the term of this patent is extended or adjusted under 35 U.S.C. 154(b) by 92 days.

(21) Appl. No.: 09/970,013

(22) Filed: Oct. 2, 2001

(65) Prior Publication Data

US 2002/0052062 A1 May 2, 2002

(30) Foreign Application Priority Data

Oct. 2, 2000 (JP) .................................. 2000-301674
Oct. 2, 2000 (JP) .................................. 2000-301675

(51) Int. Cl.[7] .............................................. H01L 21/44
(52) U.S. Cl. .................................................... 438/110
(58) Field of Search ........................... 438/106–108, 438/110–113, 124, 126, 127, 118, 123, 618, 622, 629, 614, 617; 257/666, 672, 676, 787, E33.066, E23.049

(56) References Cited

U.S. PATENT DOCUMENTS

| | | | | |
|---|---|---|---|---|
| 4,566,940 A | * | 1/1986 | Itsumi et al. | 438/296 |
| 4,755,415 A | * | 7/1988 | Iijima et al. | 428/163 |
| 5,049,085 A | * | 9/1991 | Reylek et al. | 439/91 |
| 5,366,906 A | * | 11/1994 | Wojnarowski et al. | 438/17 |
| 6,100,112 A | * | 8/2000 | Amano et al. | 438/106 |
| 6,165,907 A | * | 12/2000 | Yoneda et al. | 438/706 |
| 6,531,370 B2 | * | 3/2003 | Sakamoto et al. | 438/343 |
| 6,545,364 B2 | * | 4/2003 | Sakamoto et al. | 257/773 |
| 6,548,328 B1 | * | 4/2003 | Sakamoto et al. | 438/121 |

FOREIGN PATENT DOCUMENTS

| | | | | |
|---|---|---|---|---|
| JP | 59200427 A | * | 11/1984 | H01L/21/58 |
| WO | WO 95/26047 | | 9/1995 | |

OTHER PUBLICATIONS

U.S. patent application Ser. No. 09/944,322, Sakamoto et al., filed Mar. 7, 2002.
U.S. patent application Ser. No. 10/010,890, Sakamoto et al., filed Sep. 26, 2002.

* cited by examiner

Primary Examiner—George Fourson
Assistant Examiner—Brook Kebede
(74) Attorney, Agent, or Firm—Fish & Richardson P.C.

(57) ABSTRACT

A conductive pattern of a first layer isolated by an isolation trench is formed on a conductive foil, and a plurality of layers of the conductive patterns are formed thereon to create a multilayered wiring structure, and furthermore, a circuit element is mounted and molded with an insulating resin and the back surface of the conductive foil is etched. It is possible to implement a method of manufacturing a circuit device which provides very power saving and is suitable for mass production, then the circuit device having conductive patterns of a multilayered structure are provided.

27 Claims, 15 Drawing Sheets

130

METHOD OF MANUFACTURING CIRCUIT DEVICE

BACKGROUND OF THE INVENTION

The present invention relates to a method for manufacturing circuit devices, and particularly relates to a method for manufacturing implementing multilayered wiring circuit devices implementing multi layered wiring, that does not require any supporting substrate.

Circuit devices set in electronic equipment are heretofore desired to be made smaller in size, thinner in thickness and lighter in weight because they are used in portable telephones, portable computers, etc.

For example, a semiconductor device will be described as such a circuit device by way of example. As a typical semiconductor device, there is conventionally a packaged semiconductor device sealed by usual transfer-molding. This semiconductor device is mounted on a printed circuit board PS as shown in FIG. 19.

In the packaged semiconductor device 1, a semiconductor chip 2 is covered with a resin layer 3, and lead terminals 4 for external connection are led out from side portions of the resin layer 3.

Because the lead terminals 4 are led from the resin layer 3 to the outside, the whole size of the packaged semiconductor device 1 is, however, too large to satisfy the request to make it smaller in size, thinner in thickness and lighter in weight.

Therefore, various structures have been developed by various manufacturers in order to make packaged semiconductor devices smaller in size, thinner in thickness and lighter in weight. Recently, the packaged semiconductor devices are developed into Chip Size Packages (CSPs) such as wafer-scale CSPs as large as the chip size, or CSPs a little larger than the chip size.

FIG. 20 shows a CSP 6 which uses a glass epoxy substrate 5 as a supporting substrate and which is a little larger than the chip size. Here, description will be made on the assumption that a transistor chip T has been mounted on the glass epoxy substrate 5.

A first electrode 7, a second electrode 8 and a die pad 9 are formed on the front surface of the glass epoxy substrate 5 while a first back-surface electrode 10 and a second back-surface electrode 11 are formed on the back surface of the glass epoxy substrate 5. The first and second electrodes 7 and 8 are electrically connected to the first and second back-surface electrodes 10 and 11 via through holes TH respectively. In addition, the bare transistor chip T is firmly fixed to the die pad 9. An emitter electrode of the transistor is connected to the first electrode 7 through a metal fine wire 12, and a base electrode of the transistor is connected to the second electrode 8 through a metal fine wire 12. Further, a resin layer 13 is provided on the glass epoxy substrate 5 so as to cover the transistor chip T.

The CSP 6 uses the glass epoxy substrate 5 to thereby achieve a simple structure extending from the chip T to the back-surface electrodes 10 and 11 for external connection, compared with a wafer-scale CSP. Thus, there is a merit that the CSP 6 can be manufactured inexpensively.

In addition, the CSP 6 is mounted on a printed circuit board PS as shown in FIG. 19. Electrodes and wiring for constituting an electric circuit are provided on the printed circuit board PS, and the CSP 6, the packaged semiconductor device 1, a chip resistor CR or a chip capacitor CC, etc. are electrically connected and firmly fixed to the printed circuit broad PS.

Then, the circuit constituted on the printed circuit board will be attached to various sets.

Next, a method for manufacturing the CSP will be described with reference to FIGS. 21A to 21D and FIG. 22.

First, the glass epoxy substrate 5 is prepared as a base material (as a supporting substrate), and Cu foils 20 and 21 are bonded to both sides of the glass epoxy substrate 5 through an insulating bonding material respectively (the above step is illustrated in FIG. 21A).

Subsequently, the Cu foils 20 and 21 corresponding to the first electrode 7, the second electrode 8, the die pad 9, the first back-surface electrode 10 and the second back-surface electrode 11 are covered with an etching-proof resist 22 and patterned. Incidentally, the front surface and the back surface of the glass epoxy substrate 5 may be patterned separately (the above step is illustrated in FIG. 21B).

Subsequently, holes for the through holes TH are formed in the glass epoxy substrate by use of a drill or a laser, and then plated. Thus, the through holes TH are formed. Via the through holes TH, the first and second electrodes 7 and 8 are electrically connected to the first and second back-surface electrodes 10 and 11 respectively (the above step is illustrated in FIG. 21C).

Further, though not shown, the first and second electrodes 7 and 8 which will be bonding posts are plated with Ni, while the die pad 9 which will be a die bonding post is plated with Au. Then, the transistor chip T is die-bonded.

Finally, the emitter electrode and the base electrode of the transistor chip T are connected to the first and second electrodes 7 and 8 through the metal fine wires 12 respectively, and covered with the resin layer 13 (the above step is illustrated in FIG. 21D).

In the above-mentioned manufacturing method, a CSP type electric element using the supporting substrate 5 is produced. Alternatively, in this manufacturing method, the glass epoxy substrate 5 may be replaced by a flexible plate as a supporting substrate to produce the CSP type electric element similarly.

On the other hand, a manufacturing method useing a ceramic substrate is shown in the flow chart of FIG. 22. A ceramic substrate which is a supporting substrate is prepared, and through holes are formed therein. After that, front-surface and back-surface electrodes are printed with conductive paste, and sintered. The following steps up to covering with a resin layer are the same as those in the manufacturing method in FIGS. 21A–21D. However, differently from the flexible sheet or the glass epoxy substrate, the ceramic substrate is very fragile to be chipped easily. Therefore, there is a problem that the ceramic substrate cannot be molded by use of a mold. Thus, the CSP type electric element is produced by potting sealing resin on the ceramic substrate, hardening the sealing resin, polishing the sealing resin to be even, and finally separating the ceramic substrate with the sealing resin individually by use of a dicing apparatus. Also in the case where the glass epoxy substrate is used, there is a fear that the substrate is crushed when it is strongly held by a mold for transfer-molding.

In FIG. 20, the transistor chip T, the connection member 7 to 12, and the resin layer 13 are essential constituent elements for electric connection with the outside and protection of the transistor. However, it is difficult to provide a circuit element made smaller in size, thinner in thickness and lighter in weight, by using all of such essential elements.

In addition, the glass epoxy substrate 5 which is a supporting substrate is unnecessary by nature as described above. However, in the manufacturing method, the glass epoxy substrate 5 cannot be omitted because the glass epoxy substrate 5 is used as a supporting substrate for bonding electrodes to each other.

Because the glass epoxy substrate 5 is used, the cost increases. Further, because the glass epoxy substrate 5 is thick, the circuit element becomes thick. Accordingly, there is a limit in making the circuit element smaller in size, thinner in thickness and lighter in weight.

Further, in the glass epoxy substrate and the ceramic substrate, multilayered wires have to be formed within the substrate. Therefore, the step of forming the through hole for connecting the multi-layered wires is indispensable. Thus, there is a problem that the manufacturing process is prolonged to be unfitted for mass production.

SUMMARY OF THE INVENTION

The invention has been made in consideration of a large number of problems described above and characterized by the steps of preparing a conductive foil and forming an isolation trench having a smaller thickness than that of the conductive foil on the conductive foil in a region excluding a conductive pattern of a first layer, thereby forming the conductive pattern of the first layer, forming plural layers of the conductive pattern on the conductive pattern of the first layer through an interlayer insulating film, incorporating a circuit element into the conductive pattern which is desirable, covering the circuit element and molding a whole surface with an insulating resin, removing the conductive foil in a thick portion where the isolation trench is not provided, and isolating the insulating resin through dicing for each circuit device including the circuit element.

In the invention, the conductive foil forming the conductive pattern is a starting material, and the conductive foil has a support function before the insulating resin is molded and the insulating resin has the support function after the molding. Thus, a multilayered wiring requiring no supporting substrate can be implemented so that the conventional problems can be solved.

Furthermore, the invention is characterized by the steps of preparing a conductive foil and forming plural layers of the conductive pattern through the interlayer insulating films, incorporating a circuit element into the conductive pattern which is desirable, covering the circuit element and molding a whole surface with an insulating resin, removing the conductive foil, and isolating the insulating resin through dicing for each circuit device including the circuit element.

In the invention, furthermore, the conductive foil is a starting material, and the conductive foil has a support function before the insulating resin is molded and the insulating resin has the support function after the molding. Thus, a multilayered wiring requiring no supporting substrate can be implemented so that the conventional problems can be solved.

DETAILED DESCRIPTION OF THE PREFERRED EMBODIMENT (Embodiment 1)

First of all, a method of manufacturing a circuit device according to the invention will be described with reference to FIG. 1.

The invention shows the method of manufacturing circuit devices including the steps of preparing a conductive foil and forming an isolation trench having a smaller thickness than that of the conductive foil on the conductive foil in a region excluding a conductive pattern of a first layer, thereby forming the conductive pattern of the first layer, forming plural layers of a conductive pattern on the conductive pattern of the first layer through an interlayer insulating film, incorporating a circuit element into the conductive pattern which is desirable, covering the circuit element and molding a whole surface with an insulating resin, removing the conductive foil in a thick portion where the isolation trench is not provided, and separating the insulating resin through dicing for each circuit device.

Figure 1:
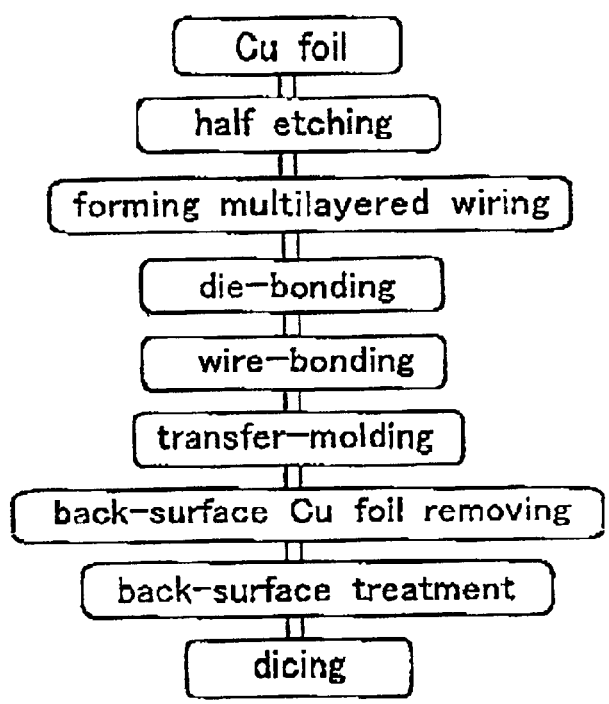
FIG. 1 is a flow chart showing a manufacture according to a first embodiment of the invention.

Although a flow chart shown in FIG. 1 is not coincident with the steps described above, the conductive pattern of the first layer is formed in two flow steps of a Cu foil and half etching. In a flow step of forming a multilayered wiring layer, plural layers of the conductive pattern is formed on the conductive foil. A circuit element is fixed to the conductive pattern and the electrode of the circuit element is connected to the conductive pattern in two flow steps of die-bonding and wire-bonding. In a flow step of transfer-molding, molding using the insulating resin is carried out. In a flow step of back-surface Cu foil removing, the conductive foil in the thick portion having no isolation trench is etched. In a flow step of a back-surface treatment, the electrode of the conductive patterns exposed to the back surface are treated. In a flow step of dicing, the insulating resin is subjected to dicing so that the individual circuit elements are separated from each other.

Each step according to the invention will be described below with reference to FIGS. 2 to 10.

Figure 2:
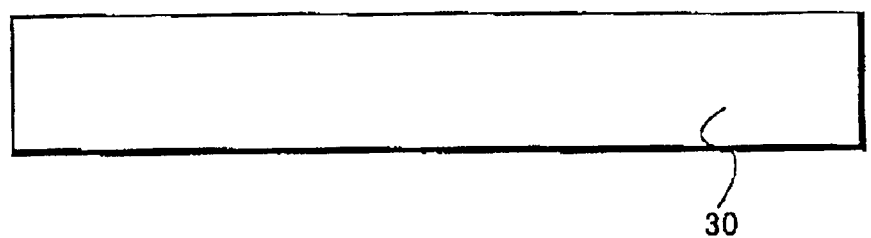
FIG. 2 is a view illustrating a method of manufacturing a circuit device according to the first embodiment of the invention.
Figure 3:
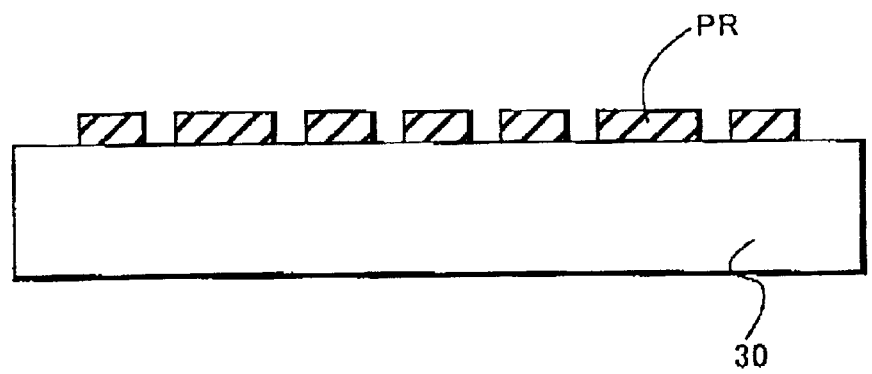
FIG. 3 is a view illustrating the method of manufacturing a circuit device according to the first embodiment of the invention.
Figure 4:
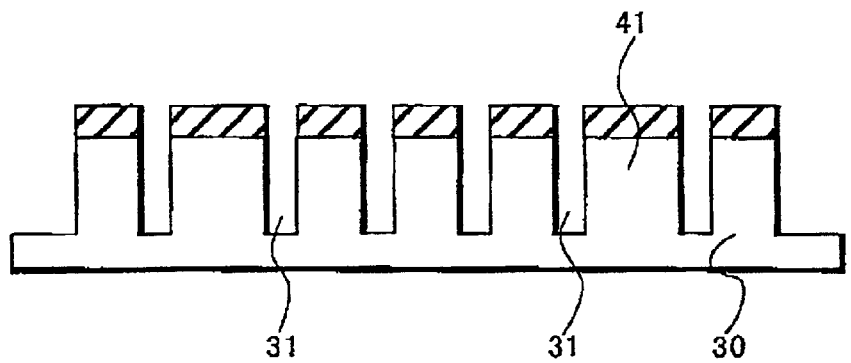
FIG. 4 is a view illustrating the method of manufacturing a circuit device according to the first embodiment of the invention.

At a first step of manufacturing method of the invention, as shown in FIGS. 2 to 4, a conductive foil is prepared and an isolation trench having a smaller thickness than that of the conductive foil is formed on the conductive foil in a region except the conductive patterns of a first layer so that the conductive pattern of the first layer is formed.

At the first step, as shown in FIG. 2, a sheet-shaped conductive foil 30 is first prepared. For the conductive foil 30, a material is selected in consideration of the sticking and plating properties of a brazing filler material. For the material, a conductive foil including Cu as a main material, a conductive foil including Al as a main material or a conductive foil including an alloy such as Fe—Ni is employed.

It is preferable that the conductive foil 30 should have a thickness of about 10 to 300 $\mu$m in consideration of subsequent etching. Herein, a copper foil having a thickness of 125 $\mu$m (2 ounces) is employed. However, thicknesses of 300 $\mu$m or more and 10 $\mu$m or less may be basically employed. As will be described below, it is sufficient that an isolation trench 31 having a smaller thickness than that of the conductive foil 30 can be formed.

Incidentally, the sheet-like conductive foil 30 is prepared in the form of a roll wound with a predetermined width, for example, a width of 45 mm. The roll of the conductive foil 30 may be conveyed for the respective steps which will be described later. Alternatively, the conductive foil 30 may be prepared in the form of strips each cut in a predetermined dimension, and conveyed for the respective steps which will be described later.

Subsequently, a conductive pattern 41 of the first layer is formed.

First of all, as shown in FIG. 3, a photoresist (an etching-resistant mask) PR is formed on the Cu foil 30, and is patterned to expose the conductive foil 30 except the regions to be the conductive pattern 41. As shown in FIG. 4, then, the conductive foil 30 is selectively etched through the photoresist PR.

The isolation trench 31 formed by the etching has a depth of 50–60 $\mu$m, for example, and a side surface thereof is roughened. Therefore, bonding to the insulating resin 50 can be enhanced.

Moreover, while the side wall of the isolation trench 31 is shown typically straightly, a structure of the side wall is varied depending on a removing method. For the removing step, it is possible to employ wet etching, dry etching, evaporation using a laser and dicing. In case of the wet etching, iron (III) chloride or copper (II) chloride is mainly employed for an etchant. The conductive foil is dipped in the etchant or is showered with the etchant. Since the wet etching is generally carried out non-anisotropically, the side surface has a curved structure.

Furthermore, the dry etching can be carried out anisotropically or non-anisotropically. At the present time, Cu cannot be removed through reactive ion etching but sputtering. Moreover, the etching can be carried out anisotropically or non-anisotropically in accordance with the conditions of the sputtering.

In case of the laser, furthermore, the isolation trench 31 can be formed by the direct irradiation of a laser beam. In this case, the side surface of the isolation trench 31 is formed rather straightly.

Figure 5A:
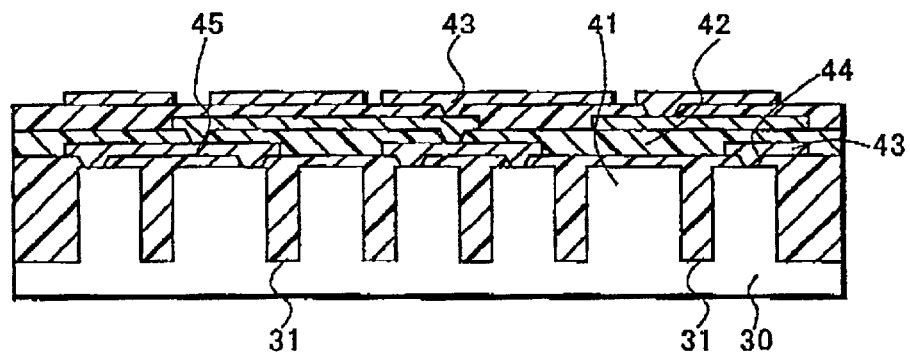
FIG. 5 is a view illustrating the method of manufacturing a circuit device according to the first embodiment of the invention.

At a second step of the invention, as shown in FIG. 5A, plural layers of the conductive pattern 43 are formed on the conductive pattern 41 of the first layer through an interlayer insulating film 42.

In the second step, a multilayered wiring structure can be implemented by providing the interlayer insulating films 42 and the conductive patterns 43. A non-photosensitive thermosetting resin or a photosensitive resist layer is used for the interlayer insulating film 42. An epoxy resin and a polyimide resin have been known as the thermosetting resin and are supplied like a liquid or a dry film. A photosensitive epoxy resin, an epoxy acrylate resin and a polyimide resin have been known as the resist layer, and similarly, are supplied like a liquid or a dry film.

Figure 5B:
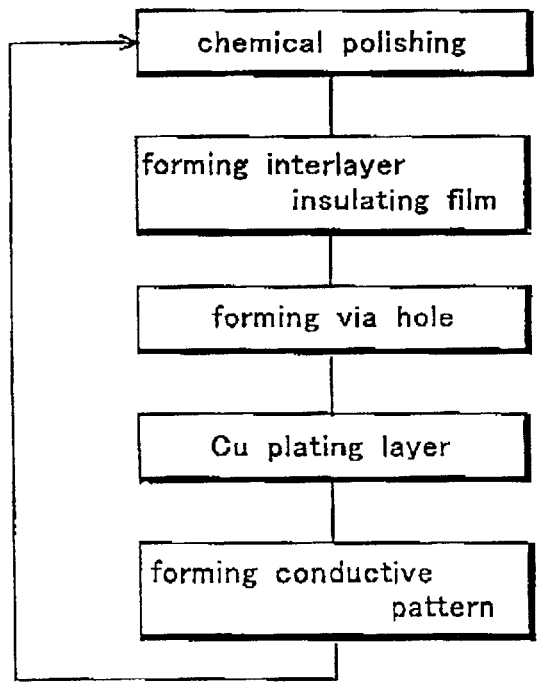

At the second step, as shown in FIG. 5B, the conductive pattern 41 of the first layer is first subjected to chemical polishing, thereby cleaning and roughening the surface, Next, the isolation trench 31 and the conductive pattern 41 of the first layer are entirely covered with a thermosetting resin and are heated and cured to form the interlayer insulating film 42 having a flat surface. Furthermore, a via hole 44 having a diameter of about 100 $\mu$m is formed on the desirable conductive pattern 41 of the first layer by using a carbon dioxide laser in the interlayer insulating film 42. Then, an excimer laser is irradiated to remove an etching residue. Subsequently, a copper plated layer 45 is formed over the entire interlayer insulating film 42 and the via hole 44. The copper plated layer 45 is formed by first carrying out electroless plating to have a small thickness of about 0.5 $\mu$m over the entire surface and then performing electroplating to have a thickness of about 20 $\mu$m such that it is not disconnected due to the step of the via hole 44. The copper plated layer 45 is patterned by using a photoresist so that the conductive pattern 43 of a second layer is formed.

By repeating the steps described above, plural layers of the conductive pattern 43 can be provided on the conductive foil 30 through the interlayer insulating films 42. In addition, since plural layers of the conductive pattern 43 is supported on the conductive foil 30 forming the conductive pattern 41 of the first layer, it has such a feature that a multilayered wiring structure can be formed without using a supporting substrate such as a glass epoxy substrate.

Moreover, when the interlayer insulating film 42 is formed by a photosensitive resist layer at the step, the interlayer insulating film 42 in a portion photosensitized in a well-known photoresist process is removed with an alkali based solvent, thereby forming the via hole 44. Other steps are the same as those in the process of forming the interlayer insulating film 42 with a thermosetting resin.

Figure 6:
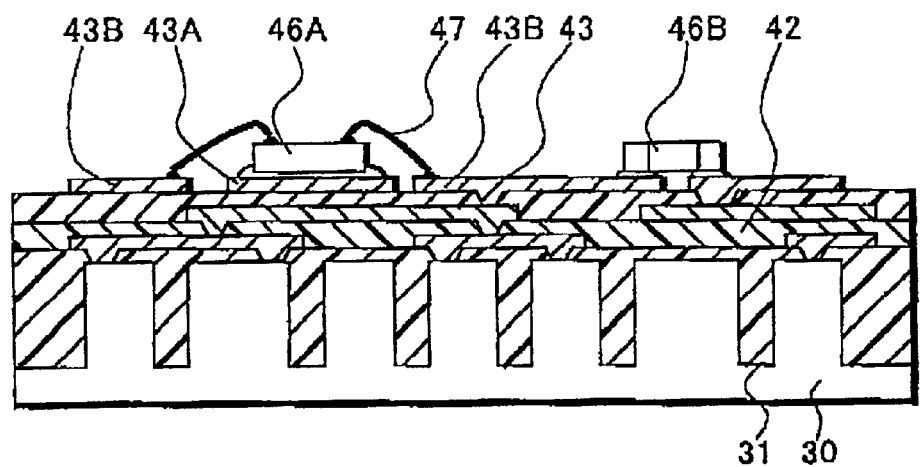
FIG. 6 is a view illustrating the method of manufacturing a circuit device according to the first embodiment of the invention.

At a third step of the invention, as shown in FIG. 6, a circuit element 46 is incorporated in the desirable conductive pattern 43.

A semiconductor element such as a transistor, a diode or an IC chip and a passive element such as a chip capacitor or a chip resistor can be used for the circuit element 46. Moreover, a face down semiconductor element such as a CSP or a BGA can also be mounted, which increases a thickness of the circuit device A bare transistor chip as a semiconductor element 46A is die-bonded to a conductive pattern 43A, and an emitter electrode and a conductive pattern 43B, and a base electrode and the conductive pattern 43B are connected through a metal fine wire 47 fixed by thermal compression ball bonding or ultrasonic wedge bonding. Moreover, a passive element 46B such as a chip capacitor is fixed to the conductive pattern 43 with a brazing filler material such as a solder or a conductive paste.

Figure 7:
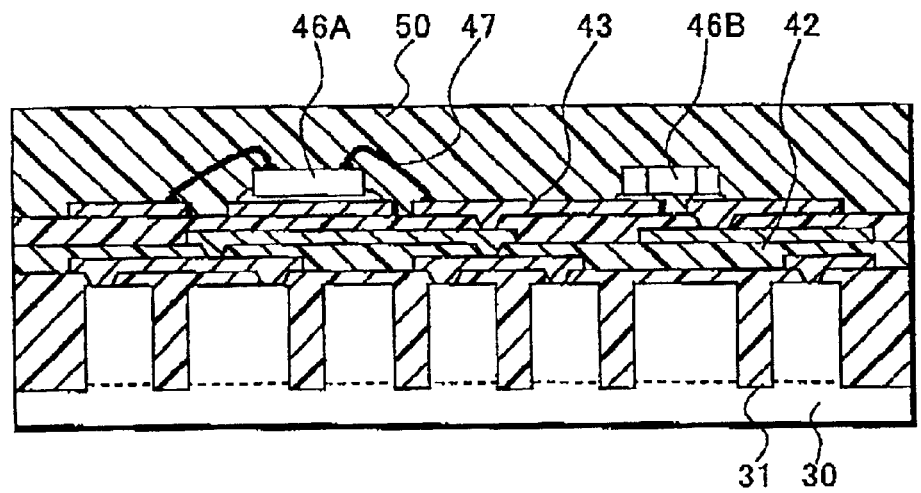
FIG. 7 is a view illustrating the method of manufacturing a circuit device according to the first embodiment of the invention.

At a fourth step of the invention, as shown in FIG. 7, the circuit element 46 is covered and entirely molded with an insulating resin 50. In particular, a plurality of circuit devices provided in the conductive foil 30 are molded by one common mold.

At the fourth step, the insulating resin 50 completely covers the circuit elements 46A and 46B and the conductive pattern 43, and the conductive pattern 43 is supported through the insulating resin 50.

Moreover, the fourth step can be implemented by transfer-molding, injection-molding, potting or dipping. For a resin material, a thermosetting resin such as an epoxy resin can be applied to the transfer-molding or the potting, and a polyimide resin and a thermoplastic resin such as polyphenylene sulfide can be applied to the injection-molding.

The thickness of the insulating resin 50 covering the surface of the conductive pattern 43 is regulated such that a depth of about 100 $\mu$m from the top of the metal fine wire 47 of the circuit element 46 can be covered. The thickness can be increased or reduced in consideration of strength of the circuit device.

Figure 19:
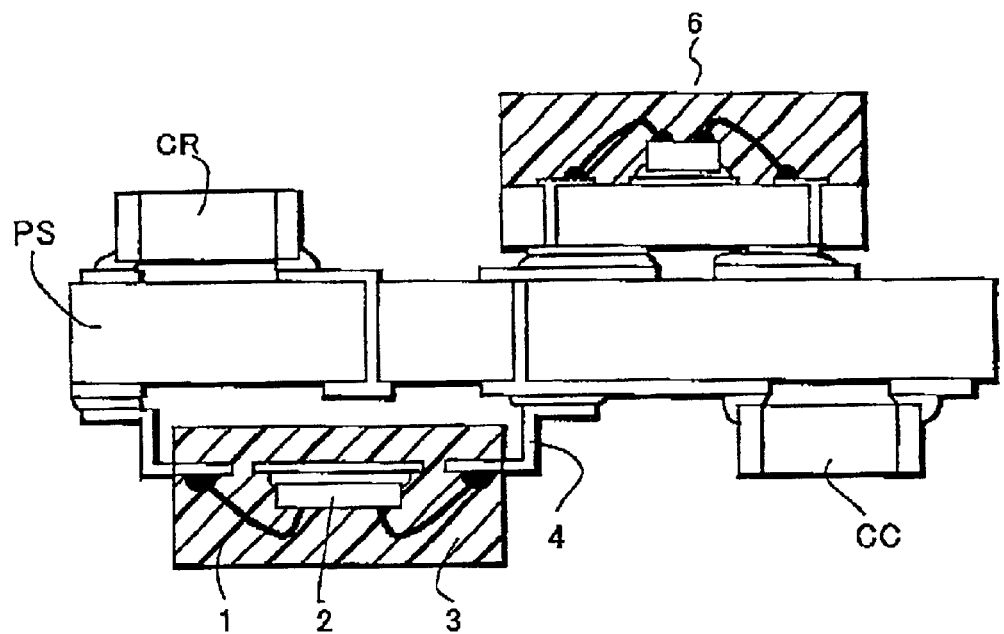
FIG. 19 is a view illustrating the mounting structure of a conventional circuit device.

The fourth step features that the conductive foil 30 to be the conductive pattern 41 of the first layer acts as a supporting substrate until the insulating resin 50 is covered. While the supporting substrate 5 which is not substantially required has been employed to form conductive paths 7 to 11 as shown in FIG. 19 in the conventional art, the conductive foil 30 to be the supporting substrate is a material required for an electrode material in the invention. For this reason, there is an advantage that a component can be omitted as much as possible to carry out a work and a cost can also be reduced.

Moreover, the isolation trench 31 is formed to have a smaller thickness than that of the conductive foil 30. Therefore, the conductive foil 30 is not individually isolated as the conductive pattern 41 of the first layer. Accordingly, the conductive foil 30 including the isolation trenches 31 can be integrally treated as a sheet-shaped conductive foil, and a work for conveying to the mold and mounting onto the mold can be carried out very easily when molding the insulating resin 50.

Figure 8:
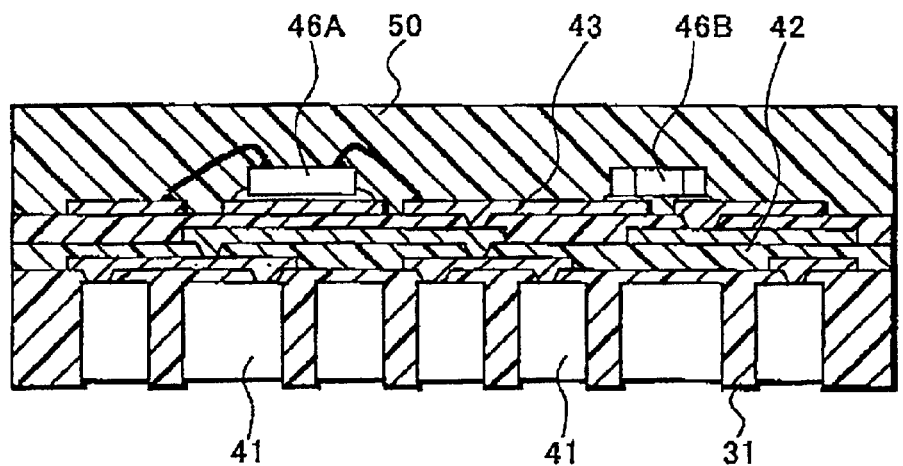
FIG. 8 is a view illustrating the method of manufacturing a circuit device according to the first embodiment of the invention.

At a fifth step of the invention, as shown in FIG. 8, the conductive foil 30 in a thick portion having no isolation trench 31 is removed.

At the fifth step, the back surface of the conductive foil 30 is removed chemically and/or physically and is isolated as the conductive pattern 41. The fifth step is carried out by polishing, grinding, etching or metal evaporation of a laser.

In an experiment, the entire back surface of the conductive foil 30 is ground by about 60–70 $\mu$m by means of a polishing device or a grinding device and the insulating film 42 filled within the isolation trench is exposed from the isolation trench 31s. A surface to be exposed is shown in a dotted line of FIG. 7. As a result, the isolation is carried out to form the conductive pattern 41 of the first layer having a thickness of about 50 $\mu$m. Moreover, the entire back surface of the conductive foil 30 may be subjected to wet etching just before the insulating film 42 filled within the isolation trench 31 is exposed, and the entire surface may be then ground by the polishing or grinding device to expose the insulating film 42 filled within the isolation trench 31. Furthermore, the entire back surface of the conductive foil 30 may be subjected to the wet etching up to the dotted line, thereby exposing the insulating film 42 filled within the isolation trench 31.

Figure 21A:
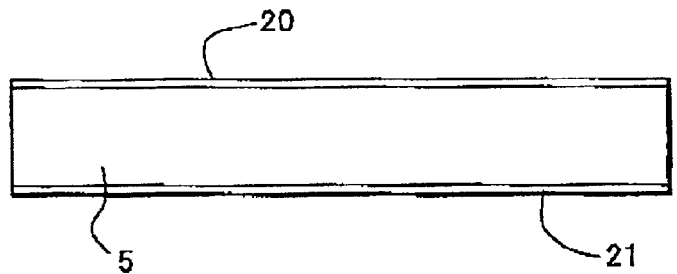
FIG. 21 is a view illustrating a method of manufacturing the conventional circuit device.
Figure 21B:
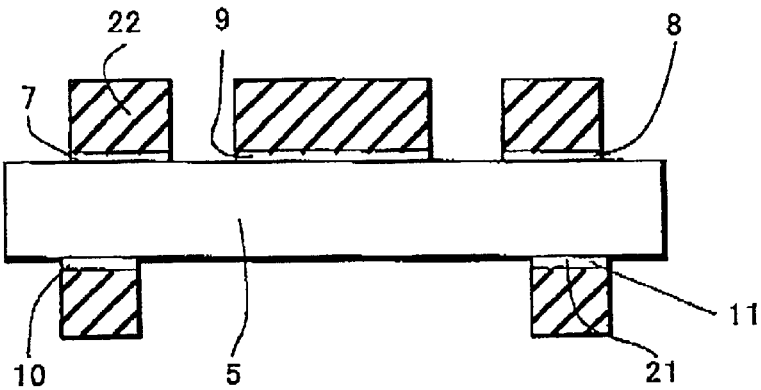
Figure 21C:
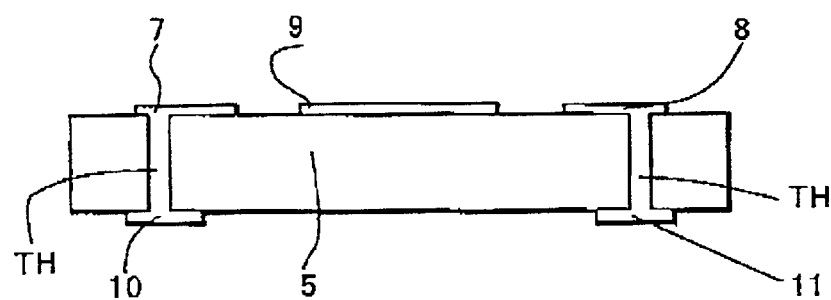
Figure 21D:
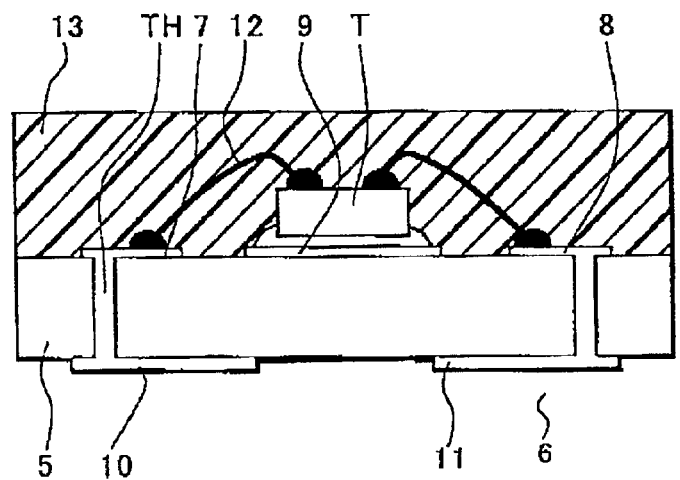

As a result, the back surface of the conductive pattern 41 of the first layer is exposed to the insulating film 42 filled within the isolation trench 31. More specifically, the surface of the insulating film 42 filled with the isolation trench 31 and that of the conductive pattern 41 of the first layer are substantially coincident with each other. In the circuit device according to the invention, therefore, a difference in level between the back surface of the supporting substrate 5 and the back-surface electrodes 10 and 11 is not provided shown in FIG. 21D. Therefore, horizontal movement can be exactly carried out by the surface tension of a solder during mounting so that self-alignment can be obtained.

Figure 9:
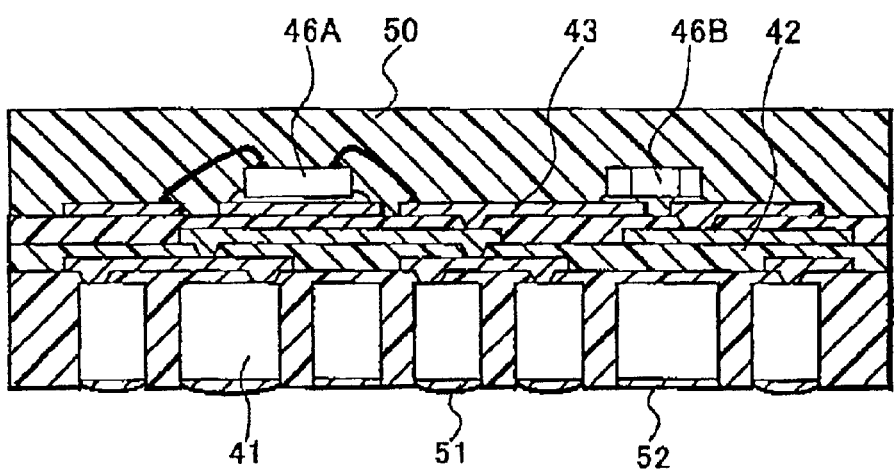
FIG. 9 is a view illustrating the method of manufacturing a circuit device according to the first embodiment of the invention.

Furthermore, the back-surface treatment of the conductive foil 30 is carried out to obtain a final structure shown in FIG. 9. More specifically, if necessary, the exposed conductive pattern 41 is covered with a conductive material such as a solder and/or Ag-plating to form the back-surface electrode 51. Thus, a circuit device 60 is finished. It is preferable that the conductive pattern 41 requiring no back-surface electrode 51 should be covered with a protective film 52 such as an epoxy resin based resist material.

Figure 10:
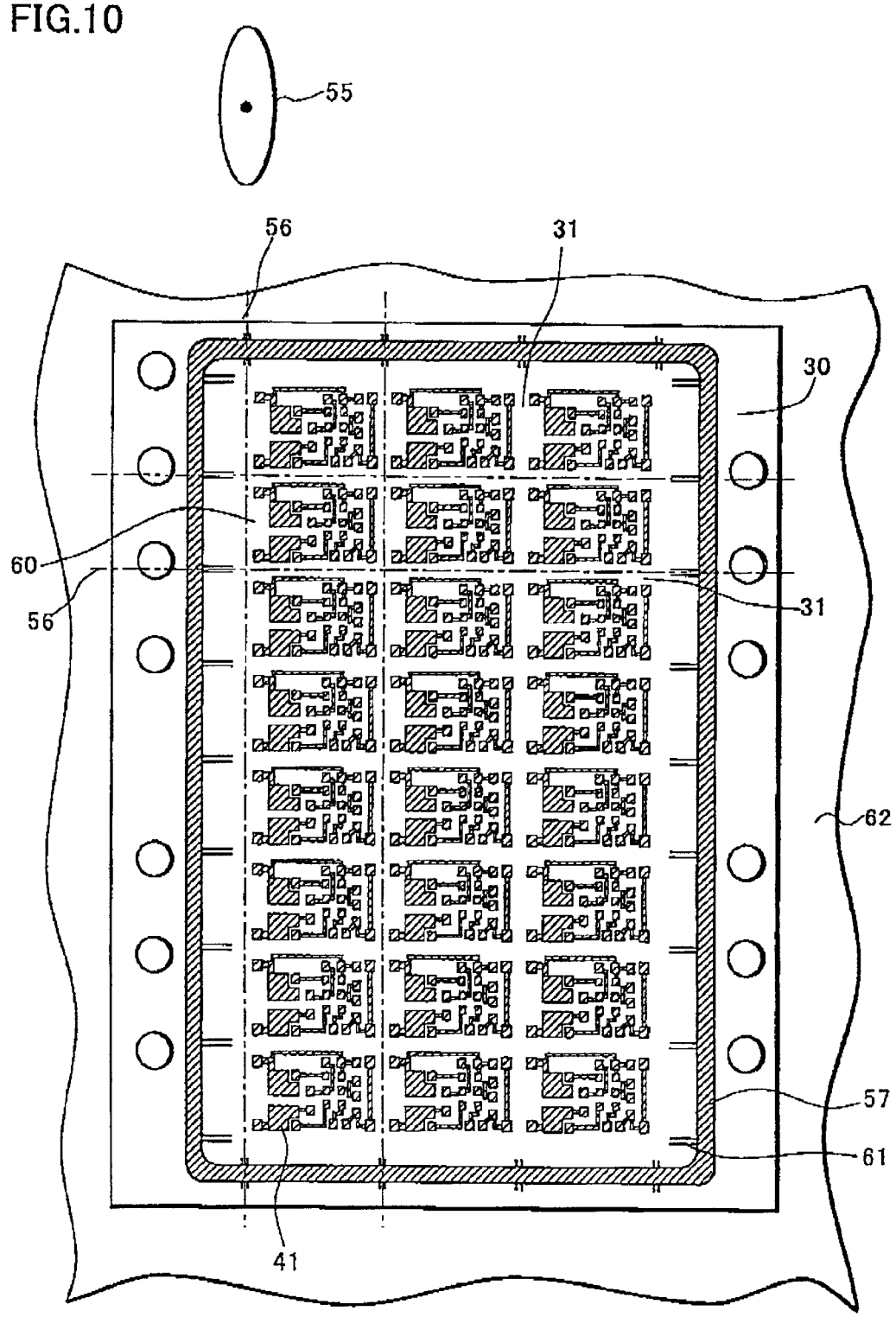
FIG. 10 is a view illustrating the method of manufacturing a circuit device according to the first embodiment of the invention.

At a sixth step according to the invention, as shown in FIG. 10, each circuit device including each circuit element 46 is separated performing the dicing.

At the sixth step, a large number of circuit devices 60 are formed on the conductive foil 30 in a matrix and a black pattern indicates the conductive pattern 41 of the first layer. A white portion indicates the isolation trench 31 among the conductive patterns 41 and among the circuit devices 60. The layers of the conductive pattern 43 and the interlayer insulating film 42 are provided under the conductive pattern 41, and the circuit element 46 is mounted on the conductive pattern 43 to be an uppermost layer and is covered with the insulating resin 50. That is, FIG. 10 shows the state that the circuit device 60 shown in FIG. 9 is turned over.

At the sixth step, a large number of circuit devices 60 supported integrally with the insulating resin 50 are bonded to a dicing sheet 62 and are adsorbed into the mounting table of a dicing device in vacuum, and the insulating film 41 filled within the isolation trench 31 is diced along a dicing line 56 between the circuit devices 60 through a dicing blade 55 and is thus separated into the individual circuit device 60.

At the sixth step, the dicing blade 55 completely cuts the insulating resin 50 to carry out the dicing in a cutting depth reaching the surface of the dicing sheet 62 thus completely separated into the individual circuit device 60. During the dicing, an alignment mark 61 provided on the inside of a frame-shaped pattern 57 around each block previously provided at the first step described above is recognized and the dicing is carried out on the basis of the alignment mark 61.

The dicing is carried out along all the dicing lines 56 in a vertical direction, and the mounting table is then rotated by 90 degrees and the dicing is carried out along the dicing lines 56 in a transverse direction, which has been well known.

At the sixth step, moreover, only the interlayer insulating film 42 filled in the isolation trench 31 and the insulating resin 50 are laminated in the dicing line 56. Therefore, the dicing blade 55 does not cut the conductive patterns 41 and 43, resulting in less abrasion. Furthermore, metal burrs are not generated and the dicing can be carried out to obtain a very accurate external shape.

Further, even after this step, the dicing sheet 62 prevents the circuit devices from being separated individually. Working can be done efficiently also in the following taping step. That is, the circuit devices supported integrally on the dicing sheet 62 are determined as to whether they are good products or not. Thus, only good products can be withdrawn from the dicing sheet 62 and received into reception holes of a carrier tape by a suction collet. Accordingly, there is a feature that even very small circuit devices are not once separated individually till they are taped.

(Embodiment 2)

First of all, a method of manufacturing a circuit device according to the invention will be described with reference to FIG. 11.

The invention comprises the steps of preparing a conductive foil and forming plural layers of the conductive pattern through the interlayer insulating films, incorporating a circuit element into the conductive pattern which is desirable, covering the circuit element and molding a whole surface with an insulating resin, removing the conductive foil, and isolating the insulating resin through dicing for each circuit device including the circuit element.

Figure 11:
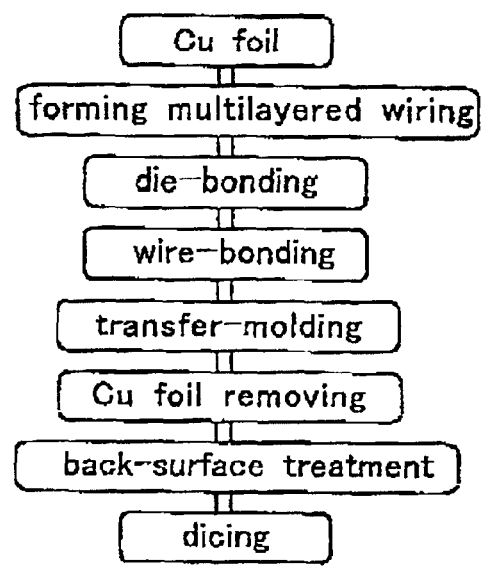
FIG. 11 is a flow chart showing a manufacture according to a second embodiment of the invention.

Although a flow chart shown in FIG. 11 is not coincident with the steps described above, a conductive foil supporting a multilayered wiring layer to be formed thereon is prepared in a flow step of a Cu foil. Plural layers of a conductive pattern is formed on the conductive foil in a flow step of forming the multilayered wiring layer. A circuit element is fixed to the conductive pattern and the electrode of the circuit element is connected to the conductive pattern in two flow steps of die-bonding and wire-bonding. In a flow step of transfer-molding, the molding using an insulating resin is carried out. In a flow step of Cu foil removing, the conductive foil is etched. In a flow step of a back-surface treatment, the electrode of the conductive patterns exposed to a back surface is treated. In a flow step of dicing, the insulating resin is subjected to dicing and is separated into an individual circuit element.

Each step according to the invention will be described below with reference to FIGS. 12 to 18.

Figure 12:
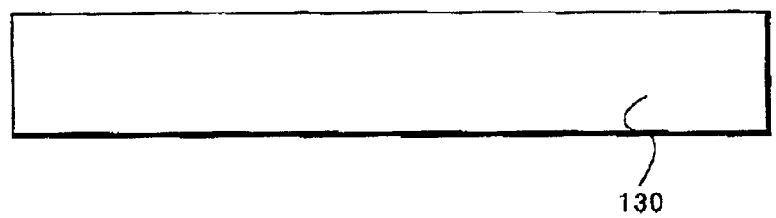
FIG. 12 is a view illustrating a method of manufacturing a circuit device according to the second embodiment of the invention.

At a first step of the invention, as shown in FIG. 12, a conductive foil 130 is prepared.

At the first step, as shown in FIG. 12, a sheet-shaped conductive foil 130 is first prepared. For the conductive foil 130, a material is selected in consideration of the sticking and plating properties of a brazing filler material. For the material, a conductive foil including Cu as a main material, a conductive foil including Al as a main material or a conductive foil including an alloy such as Fe—Ni is employed.

It is preferable that the conductive foil 130 should have a thickness of about 10 to 300 $\mu$m in consideration of subsequent etching. Herein, a copper foil having a thickness of 125 $\mu$m (2 ounces) is employed. However, thicknesses of 300 $\mu$m or more and 10 $\mu$m or less may be basically employed.

Incidentally, the sheet-like conductive foil 30 is prepared in the form of a roll wound with a predetermined width, for example, a width of 45 mm. The roll of the conductive foil 30 may be conveyed for the respective steps which will be described later. Alternatively, the conductive foil 30 may be prepared in the form of strips each cut in a predetermined dimension, and conveyed for the respective steps which will be described later.

Figure 13A:
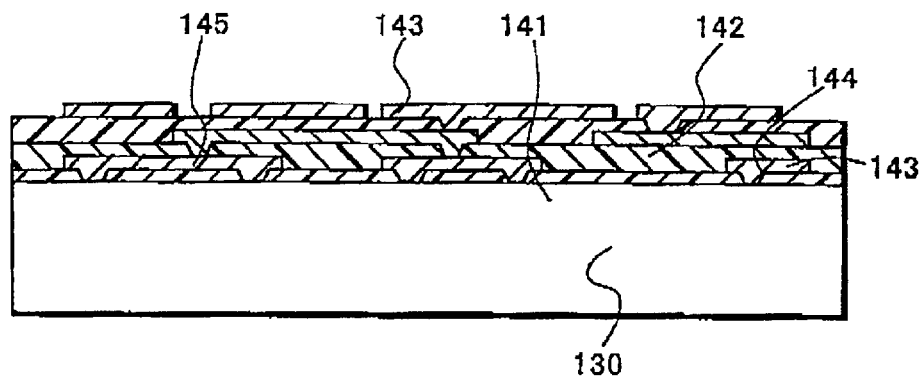
FIG. 13 is a view illustrating the method of manufacturing a circuit device according to the second embodiment of the invention.

At a second step of the invention, as shown in FIG. 13A, a plurality of layers of conductive patterns 143 is formed on the conductive foil 130 through the interlayer insulating film 142.

In the second step, a multilayered wiring structure can be implemented by providing the interlayer insulating films 142 and the conductive patterns 143. A non-photosensitive thermosetting resin or a photosensitive resist layer is used for the interlayer insulating film 142. An epoxy resin and a polyimide resin have been known as the thermosetting resin and are supplied like a liquid or a dry film. A photosensitive epoxy resin, an epoxy acrylate resin and a polyimide resin have been known as the resist layer, and similarly, are supplied like a liquid or a dry film.

Figure 13B:
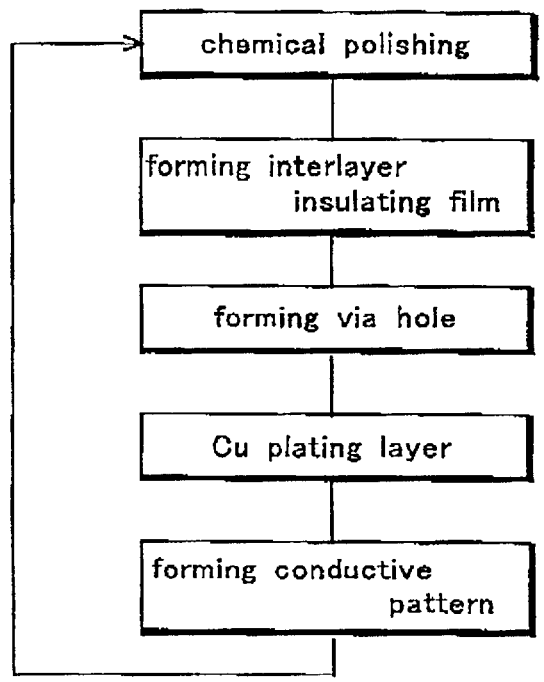

At the second step, as shown in FIG. 13B, the conductive foil 130 is first subjected to chemical polishing, thereby cleaning and roughening the surface. Next, the conductive film 131 is entirely covered with a thermosetting resin over the conductive foil 130 and is heated and cured to form the interlayer insulating film 142 having a flat surface. Furthermore, a via hole 144 having a diameter of about 100 $\mu$m is formed on the conductive film 131 by using a carbon dioxide laser in the interlayer insulating film 142. Then, an excimer laser is irradiated to remove an etching residue. Subsequently, a copper plated layer 145 is formed over the whole interlayer insulating film 142 and the via hole 144. The copper plated layer 145 is formed by first carrying out electroless plating to have a small thickness of about 0.5 $\mu$m over the whole surface and then performing electroplating to have a thickness of about 20 $\mu$m such that it is not disconnected due to the step of the via hole 144. The copper plated layer 145 is subjected to patterning by using a photoresist so that the conductive pattern 143 of a second layer is formed.

By repeating the steps described above, a plurality of layers of the conductive pattern 143 can be provided on the conductive foil 130 through the interlayer insulating film 142. In addition, since the layers of conductive pattern 143 are supported on the conductive foil 130, it has such a feature that a multilayered wiring structure can be formed without using a supporting substrate such as a glass epoxy substrate.

Moreover, when the interlayer insulating film 142 is formed by a photosensitive resist layer at the second step, the interlayer insulating film 142 in a portion photosensitized in a well-known photoresist process is removed with an alkali solvent, thereby forming the via hole 144. Other steps are the same as those in the process of forming the interlayer insulating film 142 with a thermosetting resin.

Figure 14:
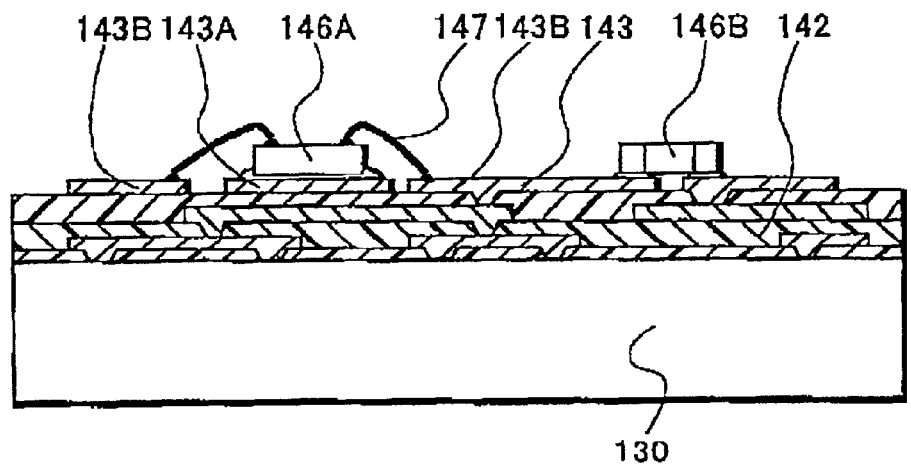
FIG. 14 is a view illustrating the method of manufacturing a circuit device according to the second embodiment of the invention.

At a third step of the invention, as shown in FIG. 14, a circuit element 146 is incorporated in the desirable conductive pattern 143.

A semiconductor element such as a transistor, a diode or an IC chip and a passive element such as a chip capacitor or a chip resistor can be used for the circuit element 146. Moreover, a face down semiconductor element such as a CSP or a BGA can also be mounted, which increases a thickness of the circuit device.

A bare transistor chip as a semiconductor element 146A is die-bonded to a conductive pattern 143A, and an emitter electrode and a conductive pattern 143B, and a base electrode and the conductive pattern 143B are connected through a metal fine wire 147 fixed by thermal compression ball bonding or ultrasonic wedge bonding. Moreover, a passive element 146B such as a chip capacitor is fixed to the conductive pattern 143 with a brazing filler material such as a solder or a conductive paste.

Figure 15:
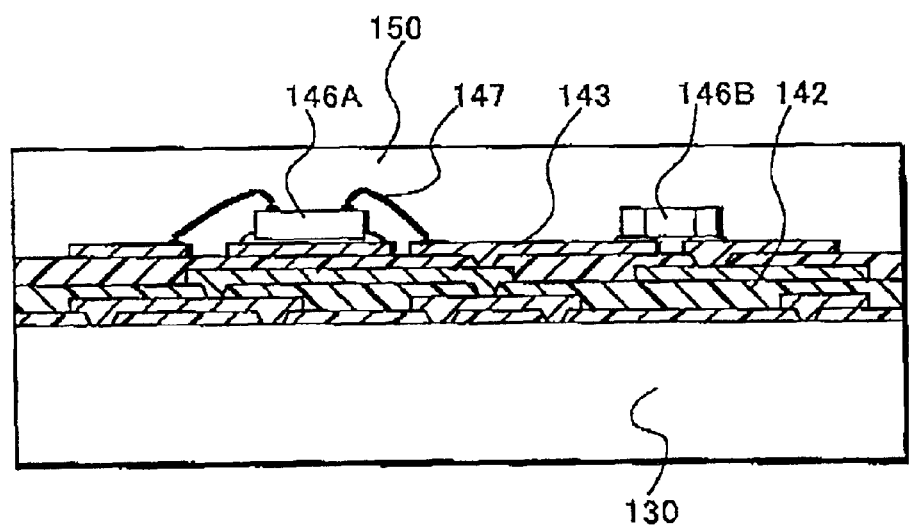
FIG. 15 is a view illustrating the method of manufacturing a circuit device according to the second embodiment of the invention.

At a fourth step of the invention, as shown in FIG. 15, the circuit element 146 is covered and entirely molded with an insulating resin 150. In particular, a plurality of circuit devices provided in the conductive foil 130 are molded by one common mold.

At the fourth step, the insulating resin 150 completely covers the circuit elements 146A and 146B and the conductive pattern 143, and the conductive pattern 143 is supported through the insulating resin 150.

Moreover, the fourth step can be implemented by transfer-molding, injection-molding, potting or dipping. For a resin material, a thermosetting resin such as an epoxy resin can be applied to the transfer-molding or the potting, and a polyimide resin and a thermoplastic resin such as polyphenylene sulfide can be applied to the injection-molding.

The thickness of the insulating resin 150 covering the surface of the conductive patter 143 is regulated such that a depth of about 100 $\mu$m from the top of the metal fine wire 147 of the circuit element 146 can be covered. The thickness can be increased or reduced in consideration of strength of the circuit device.

Figure 20:
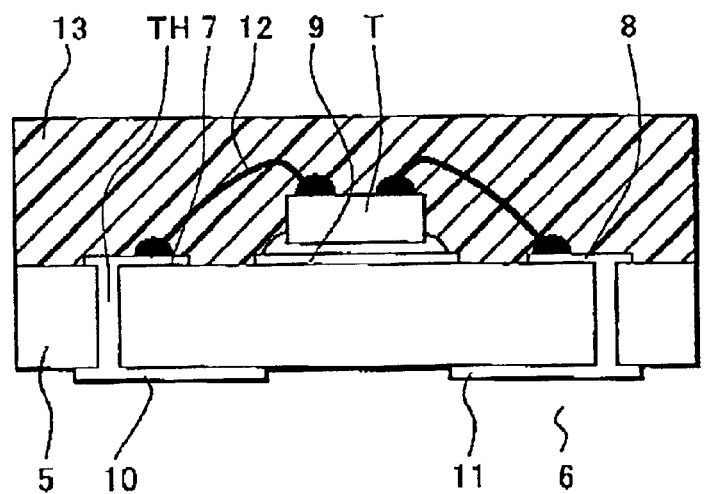
FIG. 20 is a view illustrating the conventional circuit device.

The fourth step features that the conductive foil 130 acts as a supporting substrate until the insulating resin 150 is covered. While the supporting substrate 5 which is not substantially required has been employed to form conductive paths 7 to 11 as shown in FIG. 20 in the conventional art, the conductive foil 130 to be the supporting substrate is a material required for an electrode material in the invention. For this reason, there is an advantage that a component can be omitted as much as possible to carry out a work and a cost can also be reduced. Accordingly, the sheet-shaped conductive foil 130 can be treated integrally and a work for conveying to the mold and mounting onto the mold can be carried out very easily when molding the insulating resin 150.

Figure 16:
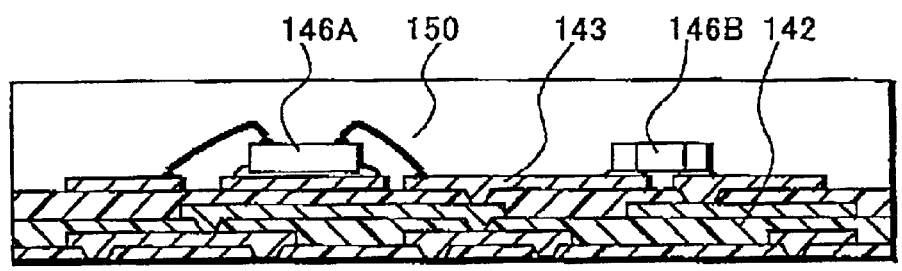
FIG. 16 is a view illustrating the method of manufacturing a circuit device according to the second embodiment of the invention.

At a fifth step of the invention, as shown in FIG. 16, the conductive foil 130 is removed.

At the fifth step, the whole conductive foil 130 is removed chemically and/or physically and the conductive pattern 143 of the multilayered wiring is separated from the conductive foil 130. The fifth step is carried out by polishing, grinding, etching or metal evaporation of a laser.

More specifically, the entire back surface of the conductive foil 130 is ground by about 60–70 $\mu$m by means of a polishing device or a grinding device and a residual portion is removed chemically by the wet etching, thereby exposing the copper plated layer 145 forming a back-surface electrode. Moreover, the whole surface of the conductive film 130 may be subjected to the wet etching, thereby exposing the copper plated layer 145 forming the back-surface electrode.

As a result, the back surface of the conductive pattern 143 of the first layer is exposed to the insulating resin 150. In the circuit device according to the invention, therefore, a difference in level between the back surface of the supporting substrate 5 and the back surface electrodes 10 and 11 is not provided shown in FIG. 20. Therefore, horizontal movement can be exactly carried out by the surface tension of a solder during mounting so that self-alignment can be obtained.

Figure 17:
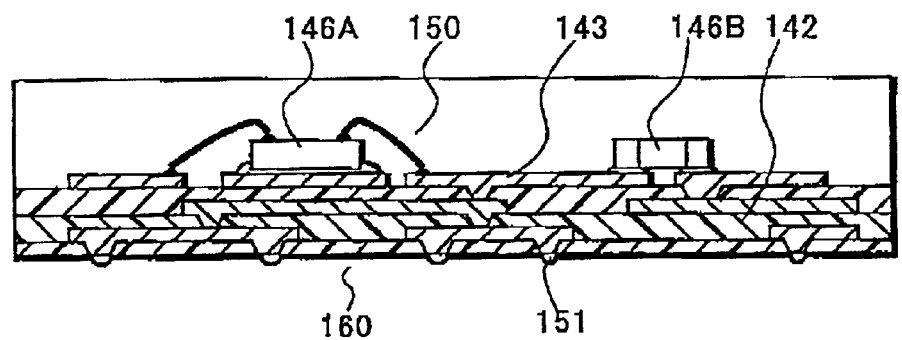
FIG. 17 is a view illustrating the method of manufacturing a circuit device according to the second embodiment of the invention.

Furthermore, the back-surface treatment of the circuit device 160 is carried out to obtain a final structure shown in FIG. 17. More specifically, if necessary, the exposed conductive film 131 is covered with a conductive material such as a solder and/or Ag-plating to form the back-surface electrode 151. Thus, a circuit device 160 is finished. It is preferable that the conductive pattern 143 requiring no back-surface electrode 151 should be covered with a protective film such as an epoxy resin based resist material.

Figure 18:
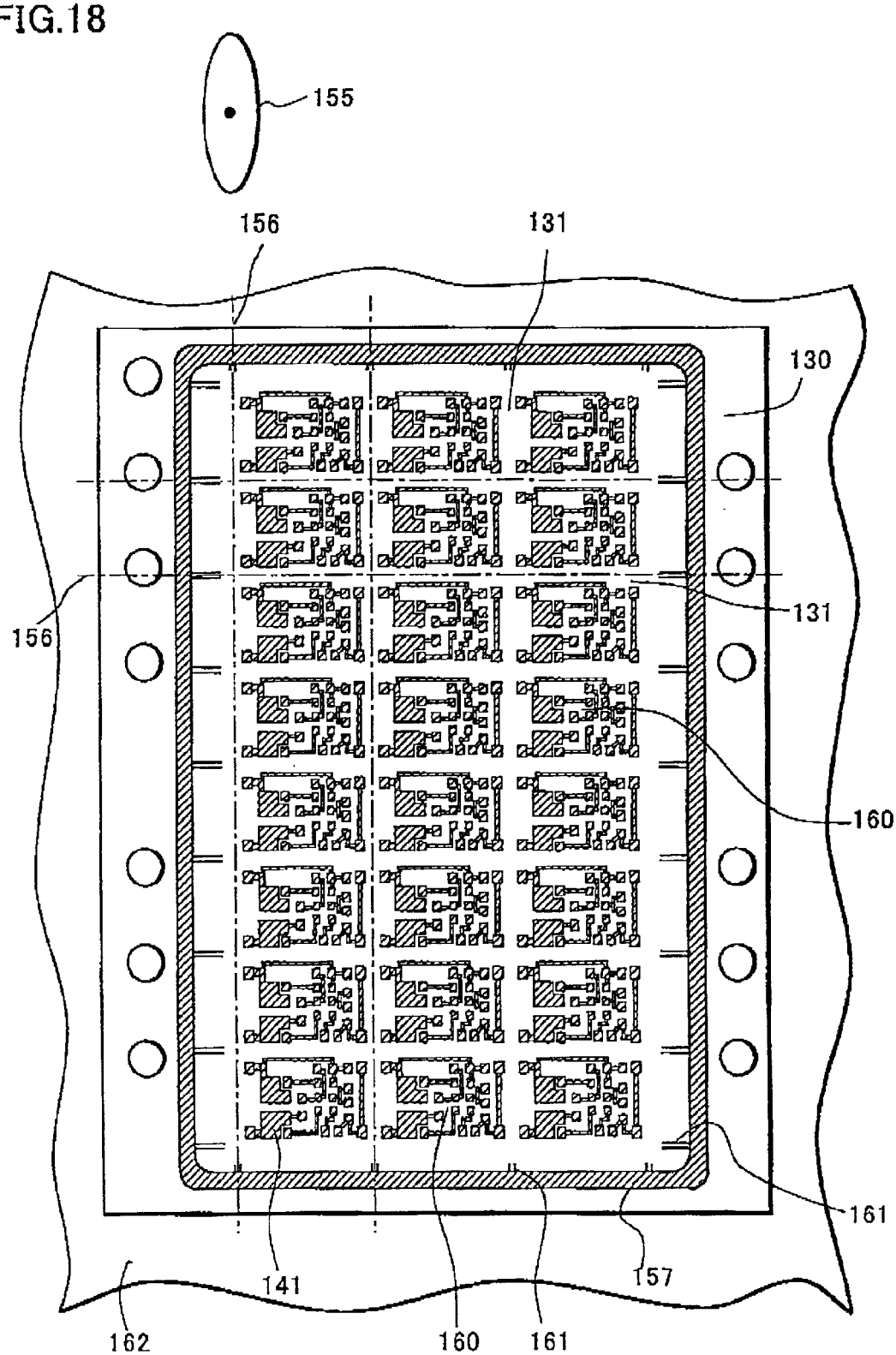
FIG. 18 is a view illustrating the method of manufacturing a circuit device according to the second embodiment of the invention.

At a sixth step according to the invention, as shown in FIG. 18, each circuit device including each circuit element 146 is separated through performing the dicing.

At the sixth step, a large number of circuit devices 160 are formed in a matrix and a black pattern indicates the conductive pattern 143 of the first layer (which is not actually shown). A white portion indicates the interlayer insulating film 142. The conductive pattern 143 of the layers and the interlayer insulating film 142 are provided under the conductive pattern 143, and the circuit element 146 is mounted on the conductive pattern 143 to be an uppermost layer and is covered with the insulating resin 150. That is, FIG. 18 shows the state the circuit device 160 shown in FIG. 17 is turned over.

At the sixth step, a large number of circuit devices 160 supported integrally with the insulating resin 150 are bonded to a dicing sheet 162 and are adsorbed into the mounting table of a dicing device in vacuum, and the insulating resin 150 is diced along a dicing line 156 between the circuit devices 160 through a dicing blade 155 and is separated into the individual circuit device 160.

At the sixth step, the dicing blade 155 completely cuts the insulating resin 150 to carry out the dicing in a cutting depth reaching the surface of the dicing sheet 162 so that the insulating resin 50 is completely separated for the individual circuit device 160. During the dicing, an alignment mark 161 provided on the inside of a frame-shaped pattern 157 around each block previously provided at the first step described above is recognized and the dicing is carried out on the basis of the alignment mark 161. The dicing is carried out along all the dicing lines 156 in a vertical direction, and the mounting table is then rotated by 90 degrees and the dicing is carried out along the dicing lines 56 in a transverse direction, which has been well known.

At the sixth step, moreover, only the interlayer insulating film 142 and the insulating resin 150 are laminated in the dicing line 156. Therefore, the dicing blade 155 does not cut the conductive pattern 143, resulting in less abrasion. Furthermore, a metal spew is not generated and the dicing can be carried out to obtain a very accurate external shape.

Further, even after this step, the dicing sheet 62 prevents the circuit devices from being separated individually. Working can be done efficiently also in the following taping step. That is, the circuit devices supported integrally on the dicing sheet 62 are determined as to whether they are good products or not. Thus, only good products can be withdrawn from the dicing sheet 62 and received into reception holes of a carrier tape by a suction collet. Accordingly, there is a feature that even very small circuit devices are not once separated individually till they are taped.

According to the invention, the conductive foil itself to be the material of the conductive pattern is caused to function as the supporting substrate, the whole body is supported on the conductive foil before the formation of the isolation trench, the mounting of the circuit element or the coating of the insulating resin, and furthermore, the insulating resin is caused to function as the supporting substrate when the conductive foil is to be isolated as each conductive pattern. Accordingly, it is possible to manufacture the circuit element, the conductive foil and the insulating resin at a minimum. As described in the conventional example, it is not necessary to use the supporting substrate in order to originally constitute the circuit device. Consequently, a cost can also be reduced.

According to the invention, moreover, the conductive foil itself to be the material of the conductive pattern is caused to function as the supporting substrate, the whole body is supported on the conductive foil before the mounting of the circuit element or the coating of the insulating resin, and furthermore, the insulating resin is caused to function as the supporting substrate when the conductive foil is to be removed. Accordingly, it is possible to manufacture the circuit element, the conductive foil, the conductive pattern and the insulating resin at a minimum. As described in the conventional example, it is not necessary to use the supporting substrate in order to originally constitute the circuit device. Consequently, a cost can also be reduced.

In the invention, furthermore, the layers of the conductive patterns can be formed on the conductive pattern. In addition, the conductive pattern is supported with the conductive foil or the insulating resin during the manufacturing process. Therefore, a conventional support insulating substrate can be omitted. As a result, a small-sized circuit device can also have a multilayered wiring structure built therein and a supporting substrate thereof can also be omitted. Therefore, it is possible to mass produce a very thin small-sized circuit device.

Furthermore, there is an advantage that the dicing line can be recognized early and reliably by using the alignment mark at the dicing step. In the dicing, only the interlayer insulating film and the insulating resin layer are cut and the conductive pattern is not cut. Consequently, the lifetime of the dicing blade can be prolonged and a metal spew can be prevented from being generated by cutting the conductive foil.

Figure 22:
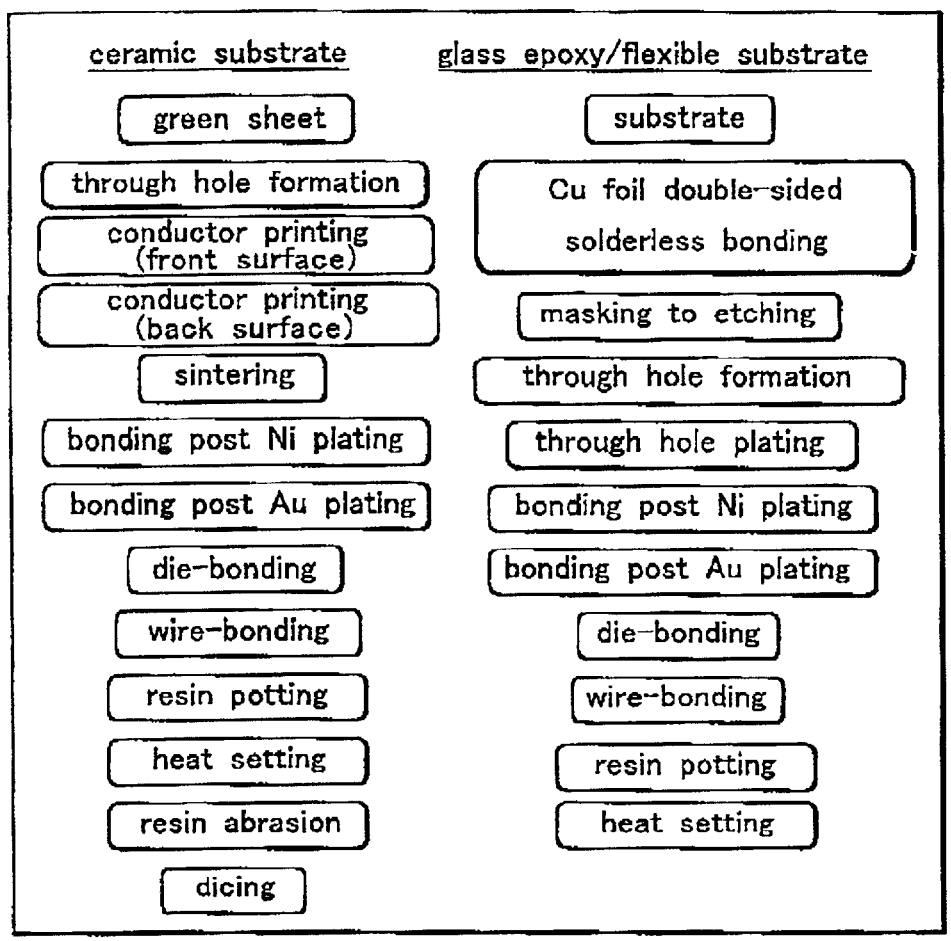
FIG. 22 is a diagram illustrating the method of manufacturing the conventional circuit device.

As is apparent from FIG. 22, finally, the step of forming a through hole and the step of printing a conductor (in a ceramic substrate) can be omitted. Therefore, there is an advantage that the manufacturing process can be shortened considerably as compared with the conventional art and all the steps can be built in. Moreover, a frame mold is never required so that the manufacturing method can give a very short time limit of delivery.

What is claimed is:

1. A method of manufacturing a circuit device comprising the steps of:
   preparing a conductive foil and forming an isolation trench having a smaller thickness than that of the conductive foil in the conductive foil, thereby forming a conductive pattern of a first layer;
   forming an interlayer insulating film over the conductive pattern of the first layer;
   forming plural layers of a conductive pattern on the conductive pattern of the first layer through the interlayer insulating film;
   mounting at least one circuit element onto the conductive pattern; covering the circuit element and entirely molding with an insulating resin; and removing the conductive foil in a portion where the isolation trench is not formed.

2. A method of manufacturing a circuit device according to claim 1 further comprising:
   separating the insulating resin through dicing for each circuit device including the circuit element.

3. The method of manufacturing a circuit device according to claim 1, wherein the conductive foil is constituted by at least one of copper, aluminum, and iron-nickel.

4. The method of manufacturing a circuit device according to claim 1, wherein the isolation trench is selectively formed in the conductive foil by chemical or physical etching.

5. The method of manufacturing a circuit device according to claim 1, wherein a thermosetting resin is used for the interlayer insulating film.

6. The method of manufacturing a circuit device according to claim 5, wherein a via hole is formed in the interlayer insulating film by a laser.

7. The method of manufacturing a circuit device according to claim 1, wherein a photosensitive resist layer is used for the interlayer insulating film.

8. The method of manufacturing a circuit device according to claim 7, wherein a via hole is formed on the interlayer insulating film through photosensitization.

9. The method of manufacturing a circuit device according to claim 1, wherein the conductive pattern of the layers is formed by a copper plated layer.

10. The method of manufacturing a circuit device according to claim 9, wherein the copper plated layer is formed by electroless plating and electroplating.

11. The method of manufacturing a circuit device according to claim 1, wherein the circuit element comprises at least one of a semiconductor bare chip and a chip element.

12. The method of manufacturing a circuit device according to claim 1, wherein the insulating resin is molded by transfer molding or potting.

13. A method of manufacturing a circuit device comprising: preparing a conductive foil and forming an isolation trench in the conductive foil thereby forming a conductive pattern; providing an interlayer insulating film pattern over the conductive foil; providing plural layers of a conductive patterns over the interlayer insulating film pattern; mounting at least one circuit element onto at least one of the plural layers of the conductive patterns; covering the circuit element and molding a whole surface with an insulating resin; and removing the conductive foil in a portion where the isolation trench is not formed.

14. A method of manufacturing a circuit device according to claim 13 further comprising: isolating the insulating resin through dicing for each circuit device including the circuit element.

15. The method of manufacturing a circuit device according to claim 13, wherein the conductive foil is constituted by at least one of copper, aluminum, and iron-nickel.

16. The method of manufacturing a circuit device according to claim 13, wherein a thermosetting resin is used for the interlayer insulating film.

17. The method of manufacturing a circuit device according to claim 16, wherein a via hole is formed on the interlayer insulating film through a laser.

18. The method of manufacturing a circuit device according to claim 13, wherein a photosensitive resist layer is used for the interlayer insulating film.

19. The method of manufacturing a circuit device according to claim 18, wherein a via hole is formed on the interlayer insulating film through photosensitization.

20. The method of manufacturing a circuit device according to claim 13, wherein the conductive pattern of the layers is formed by a copper plated layer.

21. The method of manufacturing a circuit device according to claim 20, wherein the copper plated layer is formed by electroless plating and electroplating.

22. The method of manufacturing a circuit device according to claim 13, wherein the circuit element comprises at least one of a semiconductor bare chip and a chip element.

23. The method of manufacturing a circuit device according to claim 13, wherein the insulating resin is molded by transfer molding or potting.

24. The method of manufacturing a circuit device according to claim 1, wherein a thickness of said conductive foil is 70 to 300 μm.

25. The method of manufacturing a circuit device according to claim 13, wherein a thickness of said conductive foil is 70 to 300 μm.

26. The method of manufacturing a circuit device according to claim 1, wherein the circuit element is a face down semiconductor element.

27. The method of manufacturing a circuit device according to claim 13, wherein the circuit element is a face down semiconductor element.

* * * * *